(12) United States Patent
Suzuki

(10) Patent No.: US 7,905,146 B2
(45) Date of Patent: Mar. 15, 2011

(54) INERTIAL SENSOR

(75) Inventor: Takeharu Suzuki, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 317 days.

(21) Appl. No.: 12/010,256

(22) Filed: Jan. 23, 2008

(65) Prior Publication Data
US 2008/0196497 A1 Aug. 21, 2008

(30) Foreign Application Priority Data
Feb. 15, 2007 (JP) ................................ 2007-035416

(51) Int. Cl.
*G01P 15/12* (2006.01)
*G01P 15/00* (2006.01)

(52) U.S. Cl. ................................ 73/514.33; 73/514.36

(58) Field of Classification Search ............... 73/514.33, 73/514.34, 514.38, 514.36, 514.29
See application file for complete search history.

(56) References Cited

U.S. PATENT DOCUMENTS

| 4,882,933 | A | * | 11/1989 | Petersen et al. | ............ 73/514.13 |
| 5,121,633 | A | * | 6/1992 | Murakami et al. | ......... 73/514.16 |
| 5,594,172 | A | * | 1/1997 | Shinohara | ................ 73/514.33 |
| 6,360,605 | B1 | * | 3/2002 | Pinter et al. | ................ 73/514.38 |
| 7,389,691 | B2 | * | 6/2008 | Kai | ............................ 73/514.36 |
| 7,464,591 | B2 | * | 12/2008 | Fukuda et al. | ............. 73/514.36 |
| 7,608,900 | B2 | * | 10/2009 | Tasaki | ........................ 257/417 |

FOREIGN PATENT DOCUMENTS

| JP | 2004-294230 A | 10/2004 |
| JP | 2004-301726 | * 10/2004 |
| JP | 2006-064532 | * 3/2006 |

* cited by examiner

*Primary Examiner* — Helen C. Kwok
(74) *Attorney, Agent, or Firm* — Rabin & Berdo, P.C.

(57) ABSTRACT

An inertial sensor includes a stopper having a first locking member extending from a flame onto a proof-mass, a first recess formed at the proof-mass, including a bottom surface, a second locking member extending from the proof-mass onto the edge of the flame, a second recess formed at the edge of the side member of the flame and a projection member projecting from the flame toward the proof-mass, wherein each of the first locking member and the projection member is disposed on the both sides of the second recess.

12 Claims, 7 Drawing Sheets

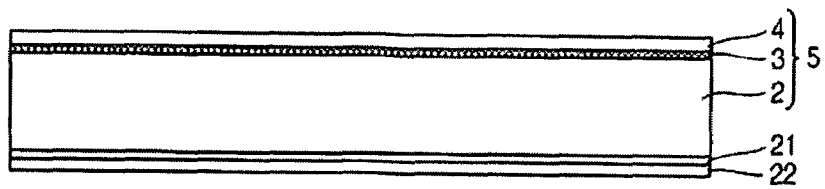
FIG 7A
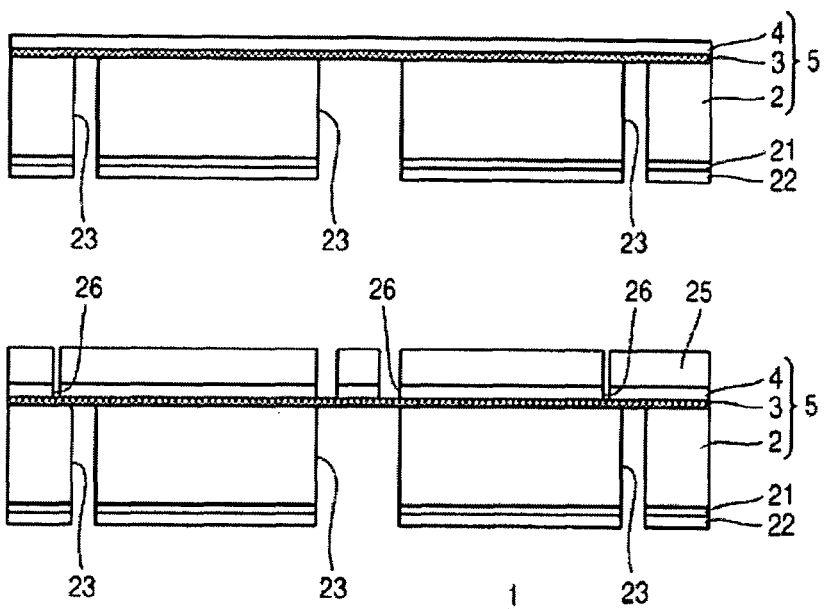
FIG 7B
FIG 7C
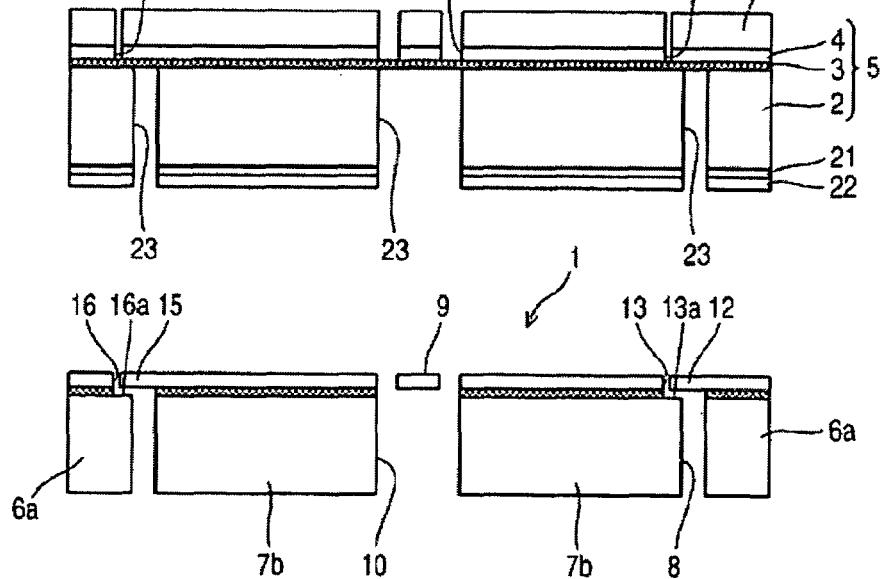
FIG 7D

INERTIAL SENSOR

CROSS-REFERENCE TO RELATED APPLICATION

This application claims the priority benefit of Japanese Patent Application No. 2007-035416, filed Jan. 25, 2007, the entire disclosure of which is incorporated herein by reference.

BACKGROUND OF THE INVENTION

1. Field of the Invention

The invention relates to an inertial sensor such as a gyroscope, specifically relates to a semiconductor acceleration sensor installed in cars, aircrafts and portable equipments for detecting the acceleration in the three-axes (an X-axis, a Y-axis and a Z-axis), each of which is mutually orthogonal.

2. Description of the Related Art

The conventional semiconductor acceleration sensor is disclosed in the reference JP 2004-294230. The semiconductor acceleration sensor disclosed in the reference JP 2004-294230 is formed with a supporting substrate and an SOI (Silicon On Insulator) substrate, which includes a thin silicon layer formed on a buried oxide layer formed directly on the supporting substrate.

As specifically disclosed in the drawings of the reference JP 2004-294230, the semiconductor acceleration sensor includes a frame, a proof-mass, four flexible members, first locking members, second locking members, first recesses, second recesses and projections. The proof-mass is disposed within the frame by slits, and the proof-mass includes a core member and four collateral proof-masses, each of which is connected to the core member. The four flexible members, which are formed of the thin silicon layers, are disposed cruciately, and each of the flexible members connects the frame to the proof-mass. Each of the first locking members, which is formed of the thin silicon layer, extends from the frame onto the edge of the proof-mass passing over one of the slits. Each of the first recesses, which is rectangular-shaped, is formed at the edge of the collateral proof-mass. The depth of each first recess is the same as the total thickness of one of the first locking members and the buried oxide layer, and each first locking member extends in the first recess. Each of the second locking members, which is formed of the thin silicon layer, extends from the collateral proof-mass onto the edge of the frame passing over one of the slits. Each of the second recesses is formed at the edge of the frame. The depth of each second recess is the same as the total thickness of one of the second locking members and the buried oxide layer, and each second locking member extends in the second recess. Therefore, an overlap area with space between the first locking member and the collateral proof-mass is created at each first recess. As well, an overlap area with space between the second locking member and the frame is created at each second recess. Further, each of the projections, whose thickness is the same as the buried oxide layer, is formed at the edge of the collateral proof-mass. The projections are disposed to sandwich the one of the flexible members.

In the semiconductor acceleration sensor disclosed in the reference JP 2004-294230, each of the first recesses is located at the center of the edge of one of the collateral proof-masses, and each of second locking members is located at the corner of the one of the collateral proof-masses.

According to the semiconductor acceleration sensor disclosed above, since the displacement of the proof-mass in the z-axis direction is restricted, the resistance characteristics against impact shock are improved.

However, since the displacement of the proof-mass is restricted by the first combinations of one of the first locking members and one of the first recesses and the second combinations of one of the second locking members and one of the second recesses, when the excessive external force such as drop impact (generally over 8000 G impact) is applied, the proof-mass is displaced in a direction, which is in parallel to the X-Y plane around the Z-axis. When the tip of the second locking member collides with the side wall of the second recess, stress is focused on the base of the second locking member because the second locking member is rectangularly-shaped, in other words, because the second locking member extends from the proof-mass in the right angle. As a result, the second locking member may be broken so that the flexible member may be transformed due to the breakage. If the flexible member is transformed, it may be impossible to detect the acceleration.

SUMMARY OF THE INVENTION

An objective of the invention is to solve the above-described problem and to provide an inertial sensor having a structure protecting the inertial sensor from the excessive impact.

The objective is achieved by an inertial sensor including a frame, a proof-mass, flexible members, and a stopper having (a) a first locking member, which is formed of the thin silicon layer, extending from the frame onto the proof-mass passing over the slit, (b) a first recess, which is formed at the proof-mass, including a bottom surface, wherein the tip of the first locking member is located above the bottom surface of the first recess with a first gap, (c) a second locking member, which is formed of the thin silicon layer, extending from the proof-mass onto the edge of the frame passing over the slit, (d) a second recess, which is formed at the edge of the frame, including a bottom surface and a side surface, wherein the tip of the second locking member is located above the bottom surface of the second recess with a first gap, and (e) a projection member, which is formed of the thin silicon layer, projecting from the side member of the frame toward the proof-mass over the slit, wherein each of the first locking member and the projection member is disposed on the both sides of the second recess, and wherein the second locking member is spaced from the side surface of the second recess with a second gap.

BRIEF DESCRIPTION OF THE DRAWINGS

The invention will be more particularly described with reference to the accompanying drawings, in which:

FIGS. 7A through 7D are sequential cross-sectional views taken along line D-D of FIG. 1 for manufacturing the inertial sensor of the first embodiment of the invention.

DETAILED DESCRIPTION OF THE PREFERRED EMBODIMENTS

The preferred embodiment of the invention is explained together with drawings as follows. In each drawing, the same reference numbers designate the same or similar components.

The First Embodiment

Figure 1:
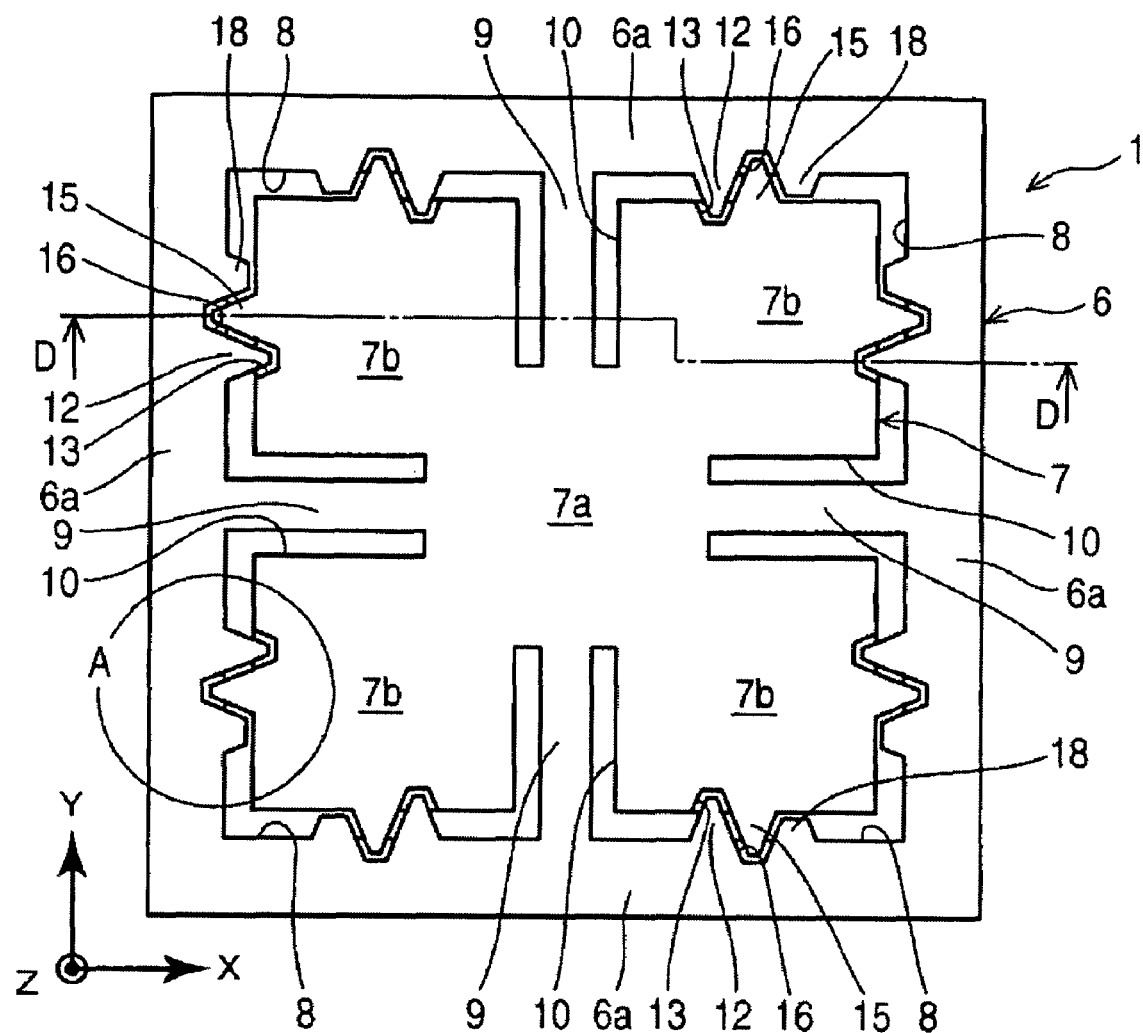
FIG. 1 is a top plan view of an inertial sensor, according to a first embodiment.
Figure 2:
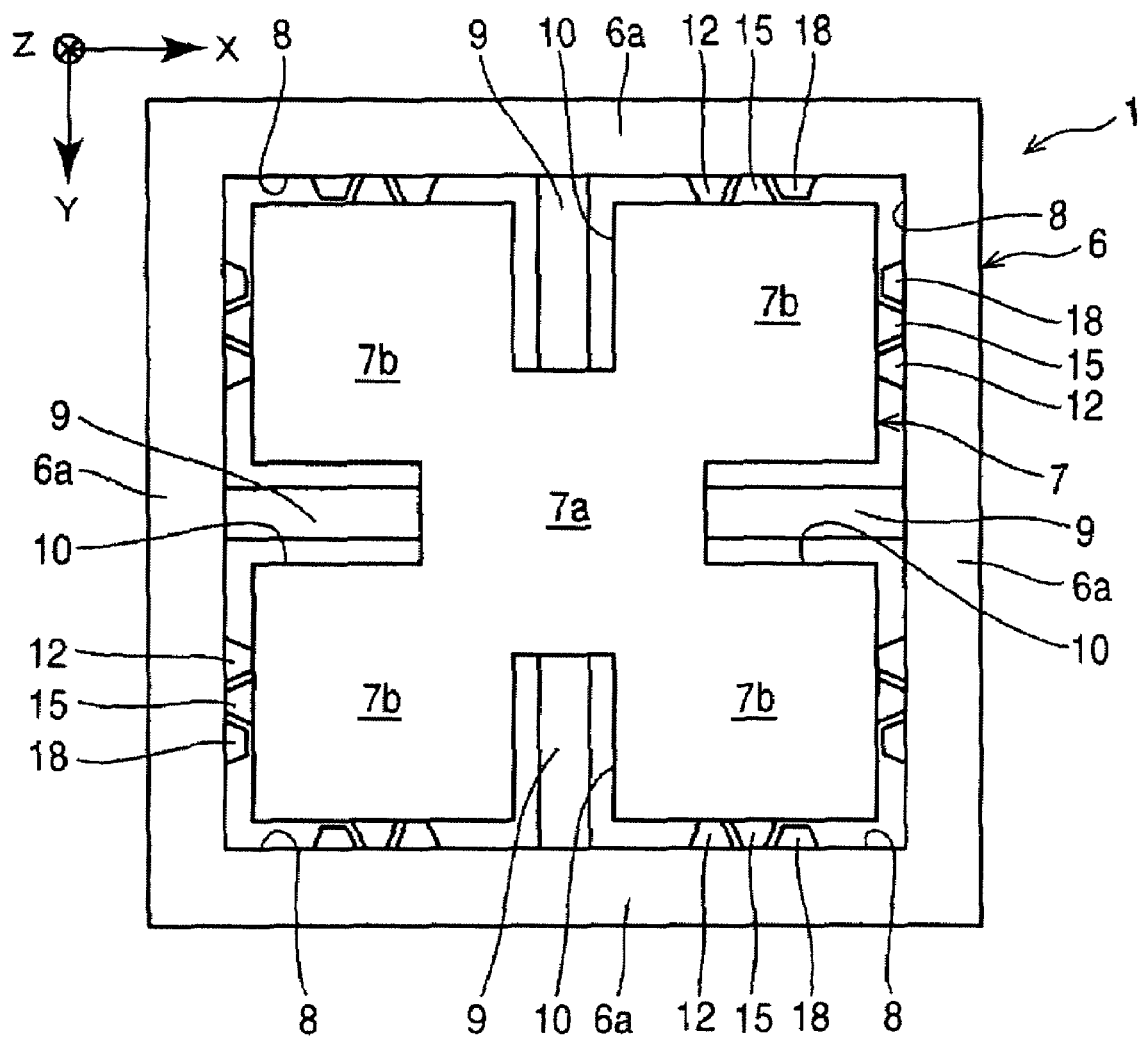
FIG. 2 is a bottom end view of the inertial sensor shown in FIG. 1.

FIG. 1 is a top plan view of an inertial sensor, according to a first embodiment, and FIG. 2 is a bottom end view of the inertial sensor shown in FIG. 1. In both drawings, a semiconductor acceleration sensor 1 as a representative of an inertial sensor is illustrated. In order to manufacture the semiconductor acceleration sensor 1, it is necessary to prepare an SOI substrate 5 as illustrated in FIG. 7A. The SOI substrate 5 includes a supporting substrate 2 whose thickness is around 500 μm of silicon, a buried oxide layer 3 whose thickness is around 1 μm of silicon dioxide formed on the supporting substrate 2, and a thin silicon layer 4 whose thickness is around 10 μm of single-crystal silicon formed on the buried oxide layer 3. The SOI substrate 5 is then divided into individual chips, each of which is for individual semiconductor acceleration sensor 1.

In FIGS. 1 and 2, the reference number 6 represents a rectangularly-shaped frame formed of the SOI substrate 5. In the first embodiment, the squarely-shaped frame is used. The frame 6 is formed with four side members, each of which is connected to another with a right angle, as an integral structure.

The reference number 7 represents a rectangularly-shaped proof-mass formed of the SOI substrate 5. In the first embodiment, the squarely-shaped proof-mass is used. The proof-mass 7 is disposed within and spaced-apart from the frame 6 with silts 8. The proof-mass 7 includes a rectangularly-shaped core member 7a and four rectangularly-shaped collateral proof-masses 7b as an integral structure. The core member 7a is located at the center position and each collateral proof-mass 7b is located at one of the corner of the core member 7a.

The reference number 9 represents a flexible member 9. Four flexible members 9, which are formed of the thin silicon layers, are disposed cruciately, and each of the flexible members 9, which connects a middle area of one of the side members 6a of the frame 6 to a middle area of one of the sides of core member 7a of the proof-mass 7, is acted as a beam member. The width of the flexible member 9 is narrower than that of a groove 10 formed in the proof-mass 7 wherein the groove 10 divides the collateral proof-mass 7b being adjacent to each other. The flexible members 9 make the proof-mass 7 possible to move in all directions. Each flexible member 9 includes a plurality of unillustrated devices having a bridge circuits for detecting acceleration, such as a piezo element.

Figure 3:
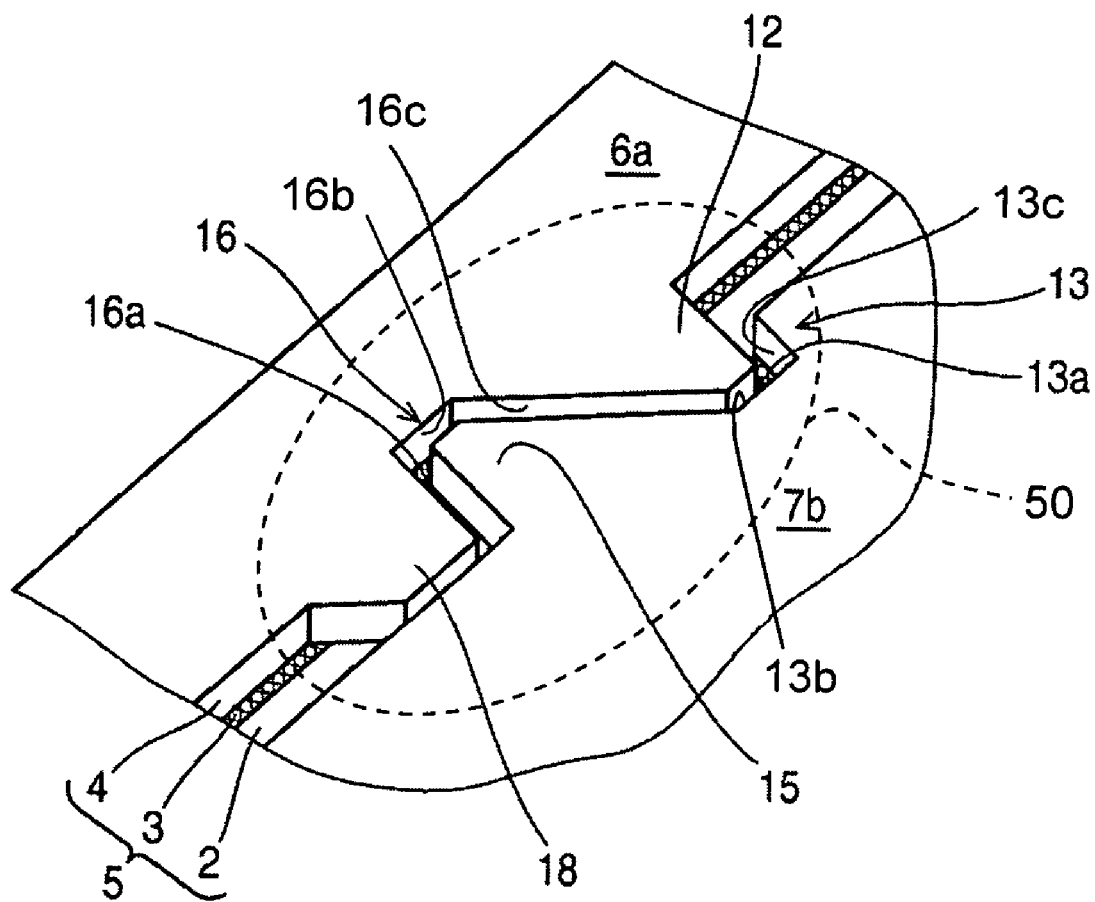
FIG. 3 is an enlarged perspective view in an area A illustrated in FIG. 1.
Figure 4:
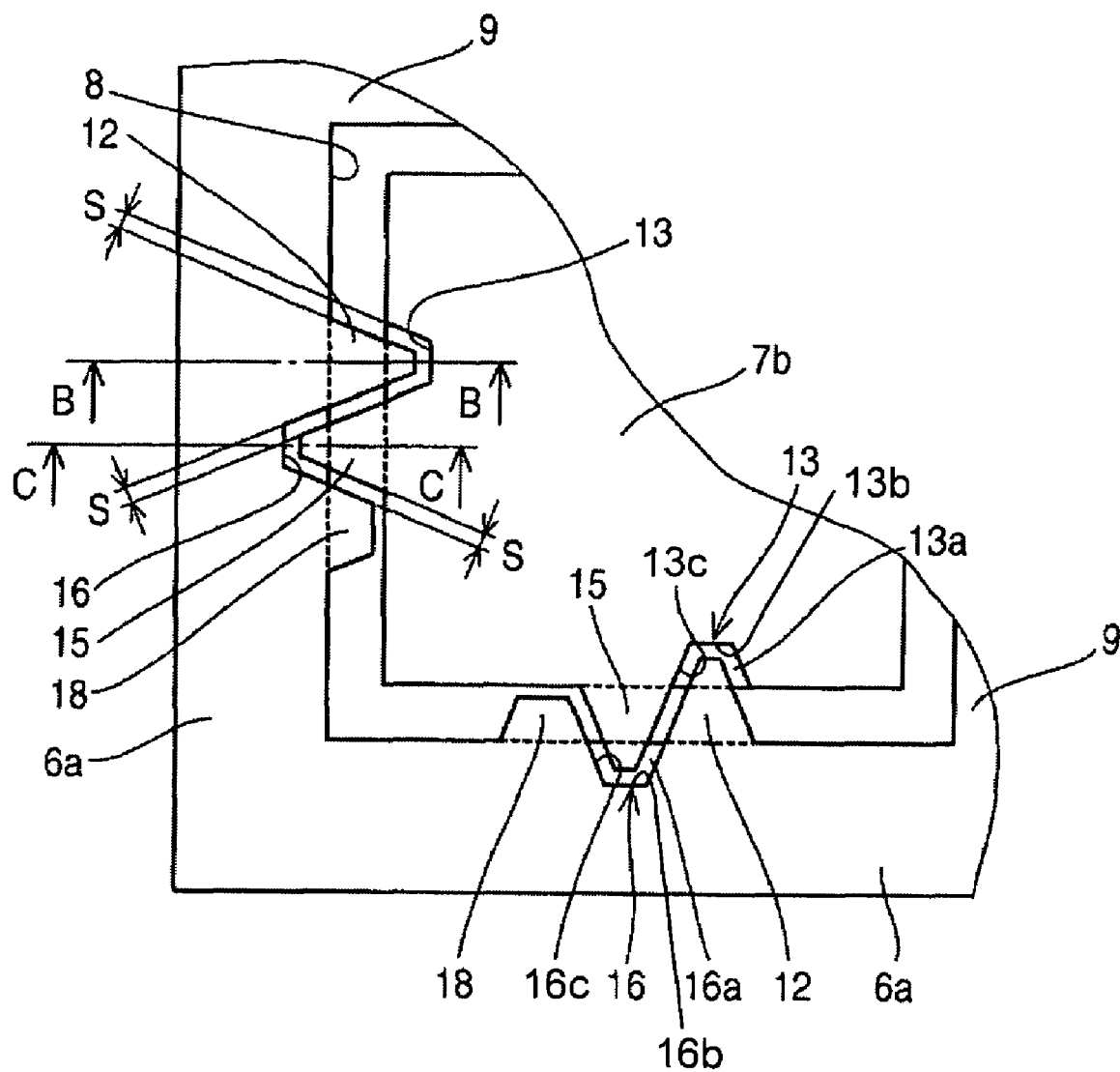
FIG. 4 is an enlarged plan view at the corner of the inertial sensor shown in FIG. 1.

With further reference to FIGS. 3 and 4, the reference number 12 represents a first locking member formed of the thin silicon layer 4. The first locking member 12 extends from the side member 6a of the frame 6 onto the edge of the collateral proof-mass 7a passing over one of the slits 8. The first locking member 12 is trapezoidally-shaped whose longer side is connected to the side member 6a of the frame 6 and whose shorter side is located above the collateral proof-mass 7a. The first locking member 12 is isosceles trapezoidally-shaped in the first embodiment.

Figure 5:
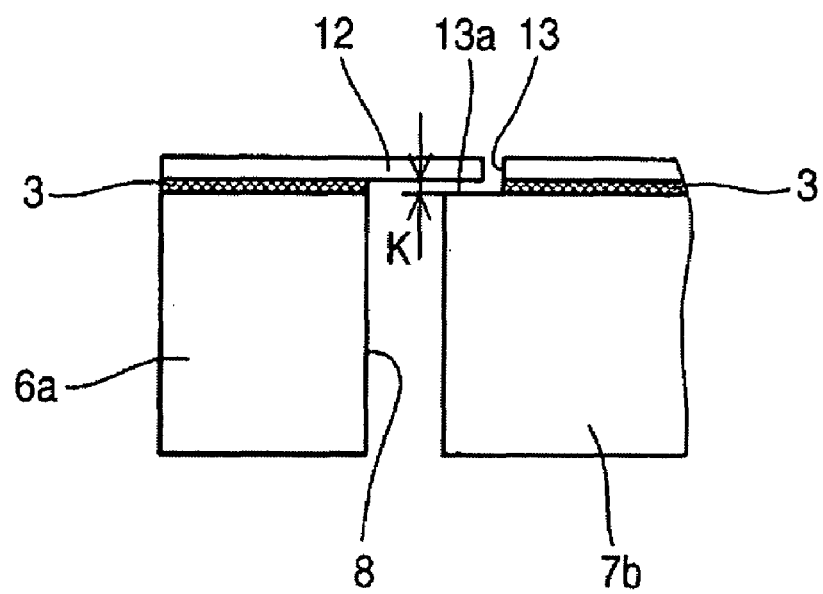
FIG. 5 is a cross-sectional view taken along line B-B of FIG. 4.

The reference number 13 represents a first recess. The first recess 13 is formed at the edge of the collateral proof-mass 7b, and has a bottom surface 13a, which faces to the back surface of the first locking member 12 with a gap K as shown in FIG. 5. The movement of the proof-mass 7 in the Z-axis direction is restricted by hitting the bottom surface 13a to the back surface of the first locking member 12. Further, as illustrated in FIG. 4, the first recess 13 is trapezoidally-shaped. Thus the periphery along with side surfaces 13b and 13c of the first recess 13 is spaced from the periphery of the first locking member 12 with a gap S.

The reference number 15 represents a second locking member formed of the thin silicon layer 4. The second locking member 15 extends from the collateral proof-mass 7b onto the edge of the side member 6a of the frame 6 passing over one of the slits 8. The second locking member 15 is trapezoidally-shaped whose longer side is connected to the collateral proof-mass 7b and whose shorter side is located above the side member 6a of the frame 6. The second locking member 15 is isosceles trapezoidally-shaped in the first embodiment.

Figure 6:
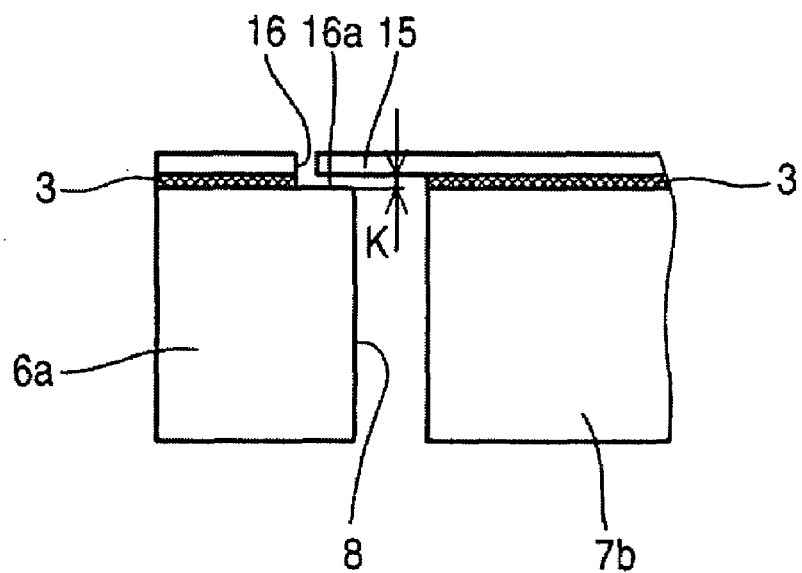
FIG. 6 is a cross-sectional view taken along line C-C of FIG. 4.

The reference number 16 represents a second recess. The second recess 16 is formed at the edge of the side member 6a of the frame 6, and has a bottom surface 16a, which faces to the back surface of the second locking member 15 with the gap K as shown in FIG. 6. The movement of the proof-mass 7 in the Z-axis direction is restricted by hitting the bottom surface 16a to the back surface of the second locking member 15. Further, as illustrated in FIG. 4, the second recess 16 is trapezoidally-shaped. Thus the periphery along with side surfaces 16b and 16c of the second recess 16 is spaced from the periphery of the second locking member 15 with the gap S.

The reference number 18 is a projection member formed of the thin silicon layer 4. The projection member 18 projected from the side member 6a of the frame 6 toward the collateral proof-mass 7b over the slit 8. However, the tip of the projection member 18 does not reach onto the edge of the collateral proof-mass. Thus, the length of the projection member 18 shorter than the width of the slit 8. The projection member 18 is trapezoidally-shaped whose longer side is connected to the side member 6a of the frame 6 and whose shorter side is located in the slit 8.

Here, the gap K is substantially the same as the thickness of the buried oxide layer 3. Further, the gap S is set to contact the tip of the second locking member 15 to the side surface 16c of the second recess 16 when the proof-mass 7 is displaced in a direction, which is in parallel to the X-Y plane around the Z-axis, caused by the impact having around 5000 G. This is because the flexible member 9 may not be broken by the transformation of the flexible member 9 caused by the impact having around 5000 G.

As shown in FIGS. 1 and 4 and as described above, the second recess 16 formed at the edge of the side member 6a of the frame 6 is disposed closely between the first locking member 12 and the projection member 18. Further, a tip region of the second locking member 15 is disposed above the second recess 16 with the gap K, and the tip of the second locking member 15 is spaced from the side surfaces 16b and 16c of the second recess 16 with the gap S. Moreover, a tip region of the first locking member 12 is disposed above the first recess 13 formed at the edge of the collateral proof-mass 7b with the gap K, and the tip of the first locking member 12 is spaced from the side surfaces 13b and 13c of the first recess 13 with the gap S. A stopper 50 in the first embodiment of the inventions is formed with the first locking member 12, first recess 13, the second locking member 15, the second recess 16 and the projection member 18 described above.

The stoppers 50 are disposed at the both sides of the flexible member 9 so that the semiconductor acceleration sensor 1 includes eight (8) stoppers 50, as illustrated in FIG. 1.

With reference to FIGS. 7A through 7D, a method of manufacturing the semiconductor acceleration sensor 1 illustrated in FIG. 1 is explained as follows. FIGS. 7A through 7D are sequential cross-sectional views taken along line D-D of FIG. 1

As shown in FIG. 7A and described above, the SOI substrate 5 having the supporting substrate 2, the buried oxide layer 3 and the thin silicon layer 4 is prepared. The thin silicon layer 4 includes a plurality of unillustrated devices having a bridge circuits for detecting acceleration, such as a piezo element. A silicon oxide layer 21 is formed on the back surface of the supporting substrate 2 by the well-known thermal oxidation process. Then, a silicon nitride layer 22 is formed on the silicon oxide layer 21 by the well-know CVD (Chemical Vapor Deposition) process.

As shown in FIG. 7B, an unillustrated resist mask is formed on the silicon nitride layer 22, and the surface of the silicon nitride layer 22 at the areas where the slit 8 and the groove 10 are formed is exposed by the photolithography. Then by using the resist mask as the mask for the anisotropic etching, the silicon oxide layer 21, the silicon nitride layer 22 and the supporting substrate 2 are etched until the back surface of the buried oxide layer 3 is exposed. As a result of the anisotropic etching, a plurality of openings 23, which will become the slit 8 or the groove 10, are formed, and then, the resist mask is removed.

As shown in FIG. 7C, another resist mask 25 is formed on the thin silicon layer 4, and the surface of the thin silicon layer 4 is exposed by the photolithography at the areas where the slits 8 are formed other than the area where the first locking member 12, the second locking member 15 and the projection member 18 are formed, at the area where the grooves 10 are formed other than the area where the flexible member 9 is formed, and at the areas where the gap S between the first locking member 12, the first recess 13 and the gap S between the second locking member 15 and the second recess 16. Then by using the resist mask 25 as the mask for the anisotropic etching, the thin silicon layer 4 is etched until the top surface of the buried oxide layer 3 is exposed. As a result of the anisotropic etching, a plurality of openings 26, which will become the slit 8, the groove 10 or a part of the gap S, are formed, and then, the resist mask 25 is removed.

As shown in FIG. 7D, the exposed buried oxide layer 3, the buried oxide layer 3 existing at the area where the first locking member 12 and the first recess 13 are overlapped, and the buried oxide layer 3 existing at the area where the second locking member 15 and the second recess 16 are overlapped, are removed by the well-known wet etching process, and the silicon oxide layer 21 and the silicon nitride layer 22 formed on the back surface of the supporting substrate 2 are removed.

The gap K and the gap S formed between the first locking member 12 and the first recess 13 and the gap K and the gap S formed between the second locking member 15 and the second recess 13 are formed by the process described above. After that, the silicon wafer having the structure illustrated in FIG. 7D is divided into individual semiconductor acceleration sensor 1. Then, the frame 6 is mounted with glue on an unillustrated board on which the individual semiconductor acceleration sensor 1 is also mounted.

According to the semiconductor acceleration sensor 1 having a structure described above, the stoppers 50 are disposed at the both sides of each of the flexible members 9, which are disposed cruciately. Thus, when the proof-mass 7 is displaced in the Z-axis direction by the relatively huge impact, the excessive transformation of the flexible member 9 is restricted by hitting the bottom surface 13a of the first recess 13 to the first locking member 12. Moreover, when the proof-mass 7 is displaced in the opposite direction on the z-axis, the excessive transformation of the flexible member 9 is restricted by hitting the second locking member 15 to the bottom surface 16a of the second recess 16. Thus, the flexible member 9 is not destroyed by the impact force applied in the Z-axis direction.

Further, when the proof-mass 7 is displaced in the X-axis direction or in the Y-axis direction by the relatively huge impact, the excessive transformation of the flexible member 9 is restricted by hitting the side surfaces 13a, 13b and 13c of the first recess 13 to the tip of the first locking member 12 and by hitting the tip of the second locking member 15, which is located at the opposite side of the proof-mass 7, to the side surfaces 16b, 16b and 16c of the second recess 16. Thus, the flexible member 9 is not destroyed by the impact force applied in the X-axis direction or in the Y-axis direction. Further, the first and the second locking members 12 and 15 are trapezoidally-shaped whose longer sides are connected the frame 6 and the proof-mass 7, respectively. Thus, the first and the second locking members are not detached from them easily.

When the bottom surface 13a of the first recess 13 hits the first locking member 12 because of the displacement of the proof-mass 7 in the Z-axis direction caused by the relatively huge impact, the gap K between the second locking member 15 and the bottom surface 16a of the second recess 16 widens as twice as the thickness of the buried oxide layer 3. The same is true in the case that the proof-mass 7 is displaced in the opposite direction on the Z-axis. When the side surface 13b of the first recess 13 hits the tip of the first locking member 12 and the tip of the second locking member 15, which is located at the opposite side of the proof-mass 7, hits the side surface 16b of the second recess 16, the gap S, which is opposite to the gap S at which the first and second locking members hit the first and second recesses, widens as twice as the normal condition.

If dust enters the widen gaps K or S, the movement of the proof-mass 7 may be interrupted. As a result, the acceleration may not be able to be measured. However, since the first and the second locking members 12 and 15 are trapezoidally-shaped, the area overlapping between the first and the second locking members 12 and 15 and the first and second recesses 13 and 16 are smaller, compared with the case the first and the second locking members 12 and 15 are rectangularly-shaped. Further, the shorter side of the first locking member 12 and the shorter side of the second locking member 15 are facing to the side surface of the first recess 13 and to the side surface of the second recess 16. Thus, because of the shape of each of the first and the second locking members 12 and 15, it is possible to reduce the possibility to enter the dust in the gaps K and S. This is one of the important characteristics when this invention is applied to a semiconductor acceleration sensor.

When the proof-mass 7 is displaced in the direction, which is in parallel to the X-Y plane around the Z-axis, caused by the excessive impact, the excessive transformation of the flexible member 9 is restricted by hitting the tip of the second locking member 15 to the side surface 16c of the second recess 16. As a result, the flexible member 9 is not destroyed by such an impact force. Further, since the second locking member 15 is trapezoidally-shaped whose longer side is connected to the collateral proof mass 7b, the stress may not be forced on the base of the second locking member 15. Thus, the second locking member 15 is not detached from the collateral proof mass 7b easily.

Further, since the projection member 18, which is disposed next to the second locking member 15, and is disposed at the opposite side of the first locking member 12, is formed adjacent to the second recess 16, the movement of the tip of the second locking member 15 is suppressed by the side of the projection member 18 or the side of the first locking member 12 even when the tip of the second locking member 15 is caused to move toward the slit 8 over the second recess 16 by the excessive impact.

According to the semiconductor acceleration sensor of the first embodiment of the invention, the stopper 50, which is formed with the first locking member 12 and the projection member 18 each of which is disposed on the both sides of the second recess 16, and with the second locking member 15 being spaced from the side surfaces 16b and 16c of the second recess 16 with the gap S, are disposed at the both sides of the flexible member 9. Thus, when the proof-mass 7 is displaced in the direction, which is in parallel to the X-Y plane around the Z-axis, caused by the excessive impact, the excessive transformation of the flexible member 9 is restricted by hitting the tip of the second locking member 15 to the side surface 16c of the second recess 16. As a result, the flexible member 9 is not destroyed by such an impact force.

Furthermore, since each of the first and second locking members 12 and 15 and the projection member 18 is trapezoidally-shaped whose longer side is connected to the frame 7, the collateral proof mass 7b and frame 7, respectively, the stress may not be forced on its base. Thus, the first and second locking member and the projection member 12, 15 and 18 are not detached easily.

Further, the gap K formed between the first locking member 12 and the first recess 13 or the second locking member 15 and the second recess 16 is uniformly set as the same as the thickness of the buried oxide layer 3. Thus, it is easy to adjust the gap K by changing the thickness of the buried oxide layer 3.

The Second Embodiment

Figure 8:
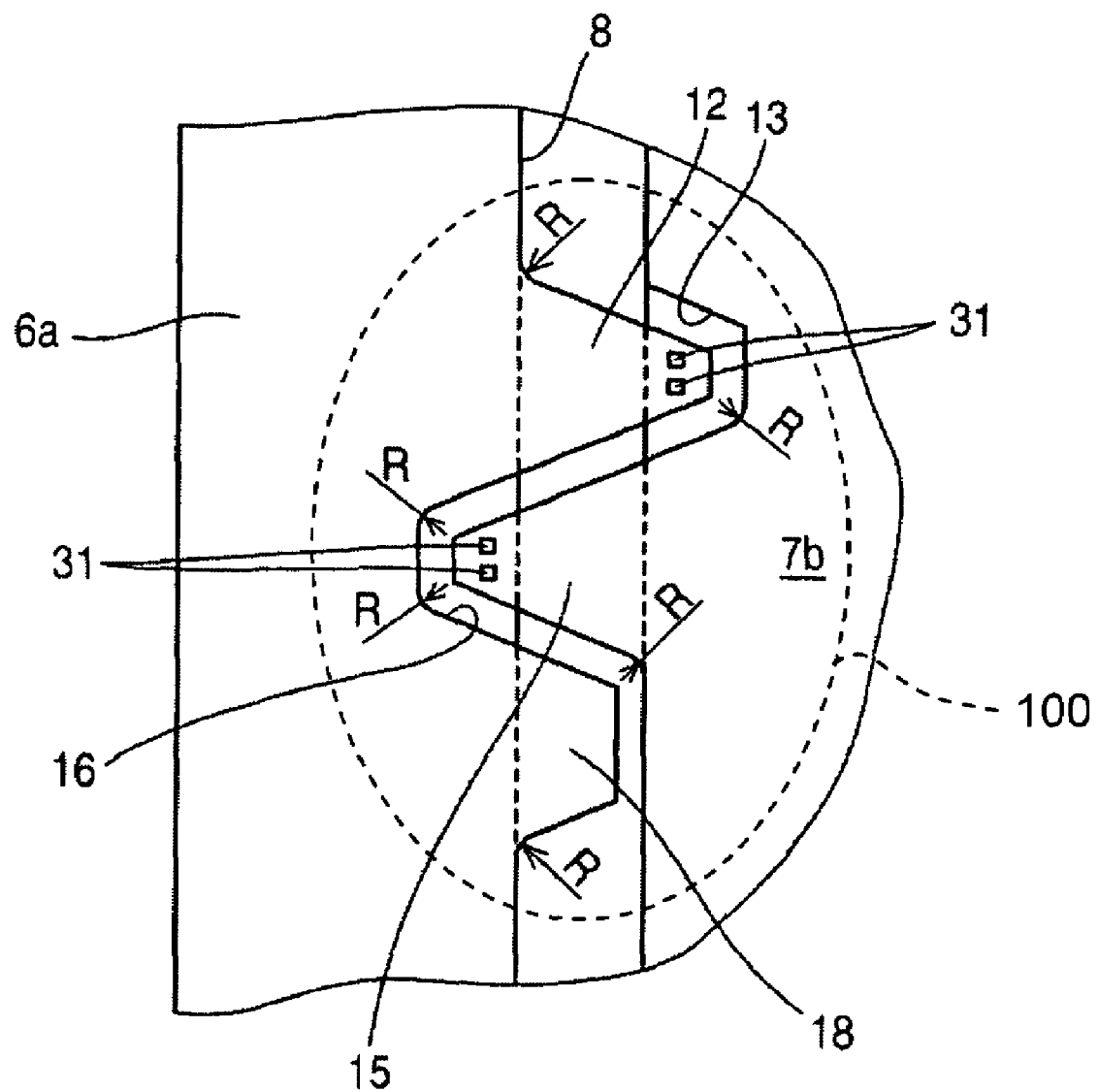
FIG. 8 is an enlarged top plan view at an area where a stopper is formed in an inertial sensor of a second embodiment.

FIG. 8 is an enlarged top plan view at an area where a stopper is formed in an inertial sensor of a second embodiment. In FIG. 8, the same reference numbers designate the same or similar components used in FIG. 4.

As shown in FIG. 8, the first locking member 12 includes two through-holes 31 in the area where the first locking member 12 is overlapped with the first recess 13. The second locking member 15 includes two through-holes 31 in the area where the second locking member 15 is overlapped with the first recess 16.

Further, each of the first and the second locking members 12 and 15 and the projection member 18 includes fillets R formed of the thin silicon film 4 at its base. Thus, the base of each of the first and the second locking member 12 and 15 and the projection member 18 I rounded at the both sides.

The through-holes 31 and fillet R are formed at the same time when the openings 26 are formed in t he thin silicon film 4, as shown in FIG. 7C.

According to the semiconductor acceleration sensor of the second embodiment of the invention, the through-holes 31 are formed in the area where the first locking member 12 is overlapped with the first recess 13 and in the area where the second locking member 15 is overlapped with the second recess 16, the buried oxide layer at the overlapped areas can be easily removed in the step shown in FIG. 7D. Thus, it can be expected to increase production efficiency of the semiconductor acceleration sensor.

Moreover, since the fillets R are formed at the bases at its both sides for each of the first and the second locking member 12 and 15 and the projection member 18, the stress concentration at their bases may be further alleviated.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them.

For example, while the semiconductor acceleration sensor is explained as a representative of the inertial sensor, the invention can be used for any other inertial sensor, such as a gyroscope for detecting angular velocity.

Various other modifications of the illustrated embodiment will be apparent to those skilled in the art on reference to this description. Therefore, the appended claims are intended to cover any such modifications or embodiments as fall within the true scope of the invention.

What I claim is:

1. An inertial sensor, comprising:
    a rectangular frame formed of a SOI substrate, which is formed with a supporting substrate,
    an insulating layer formed on the supporting substrate and a thin silicon layer formed on the insulating layer, the frame including a four side members, each of which is connected to another with a right angle;
    a proof-mass disposed within and spaced-apart from the frame with a slit;
    four flexible members, which are formed of the thin silicon layer, being disposed cruciately, wherein each of which connects a middle area of one of the side members of the frame to the proof-mass; and
    a stopper including,
    (a) a first locking member, which is formed of the thin silicon layer, extending from the side member of the frame onto an edge of the proof-mass passing over the slit,
    (b) a first recess, which is formed at the edge of the proof-mass, including a bottom surface, wherein a tip of the first locking member is located above the bottom surface of the first recess with a first gap,
    (c) a second locking member, which is formed of the thin silicon layer, extending from the proof-mass onto the edge of the side member of the frame passing over the slit,
    (d) a second recess, which is formed at the edge of the side member of the frame, including a bottom surface and a side surface, wherein the tip of the second locking member is located above the bottom surface of the second recess with the first gap, and
    (e) a projection member, which is formed of the thin silicon layer, projecting from the side member of the frame toward the proof-mass over the slit,
    wherein
    each of the first locking member and the projection member is disposed on a side of the second recess,
    the second locking member is spaced from the side surface of the second recess with a second gap, and
    the second locking member is disposed between the projection member and the first locking member.

2. An inertial sensor as claimed in claim 1, further including at least one additional stopper, wherein each stopper is disposed on a side of one of the flexible members.

3. An inertial sensor as claimed in claim 2, wherein the proof-mass includes a core member and four collateral proof-masses, each collateral proof-mass being extended in four directions, each of which has a right angle to another, from the core member.

4. An inertial sensor as claimed in claim 1, wherein each of the first and second locking members is trapezoidal with a longer side connected to the frame and the collateral proof mass, respectively, and wherein the projection member is trapezoidal with a longer side connected to the frame.

5. An inertial sensor as claimed in claim 1, wherein the first locking member includes a through-hole in a first area where the first locking member is overlapped with the first recess, and the second locking member includes a through-hole in a second area where the second locking member is overlapped with the second recess.

6. An inertial sensor as claimed in claim 1, wherein a respective base of each of the first and the second locking members includes a fillet.

7. An inertial sensor as claimed in claim 1, wherein the first gap is substantially the same as a thickness of the insulating layer.

8. An inertial sensor as claimed in claim 7, wherein the first gap includes an uniform width.

9. An inertial sensor as claimed in claim 1, wherein the second gap includes an uniform width.

10. An inertial sensor as claimed in claim 1, wherein the inertial sensor is a semiconductor acceleration sensor.

11. An inertial sensor as claimed in claim 1, wherein the inertial sensor is a gyroscope.

12. The inertial sensor of claim 1, wherein
a side of the first locking member faces a side of the second locking member across the second gap of the second recess,
a side of the projection member faces another side of the second locking member across the second gap the second recess, and
another side of the projection member opposite from the side facing the second locking member is shorter than the side facing the second locking member.

* * * * *